US007919550B2

(12) United States Patent
Kawaguchi et al.

(10) Patent No.: US 7,919,550 B2
(45) Date of Patent: Apr. 5, 2011

(54) ENCAPSULANT OF EPOXY GROUP-CONTAINING (METH)ACRYLIC POLYMER, ANHYDRIDE AND (METH)ACRYLIC MONOMER

(75) Inventors: Yujiro Kawaguchi, Osaka (JP); Shigeki Naitoh, Ibaraki (JP); Toshiyuki Hasegawa, Nara (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 12/149,916

(22) Filed: May 9, 2008

(65) Prior Publication Data

US 2008/0249220 A1  Oct. 9, 2008

Related U.S. Application Data

(62) Division of application No. 10/472,091, filed as application No. PCT/JP02/09310 on Sep. 12, 2002, now Pat. No. 7,423,083.

(30) Foreign Application Priority Data

Sep. 14, 2001 (JP) .................................. 2001-279518

(51) Int. Cl.
*C08K 5/101* (2006.01)
*C08L 33/14* (2006.01)
(52) U.S. Cl. ........................................ 524/291; 524/558
(58) Field of Classification Search .................. None
See application file for complete search history.

(56) References Cited

U.S. PATENT DOCUMENTS

| 2,768,153 | A |   | 10/1956 | Shokal |   |
|---|---|---|---|---|---|
| 4,091,048 | A |   | 5/1978 | Labana et al. |   |
| 4,931,509 | A |   | 6/1990 | Yagishita et al. |   |
| 5,214,104 | A |   | 5/1993 | Wamprecht et al. |   |
| 5,601,878 | A | * | 2/1997 | Kranig et al. | 427/386 |
| 5,719,212 | A |   | 2/1998 | Nakae et al. |   |
| 7,034,075 | B1 | * | 4/2006 | Torborg et al. | 525/170 |
| 7,423,083 | B2 | * | 9/2008 | Kawaguchi et al. | 524/291 |

FOREIGN PATENT DOCUMENTS

| EP | 0789064 | A2 |   | 8/1997 |
|---|---|---|---|---|
| JP | 60217230 | A |   | 10/1985 |
| JP | 61-206943 | A | * | 9/1986 |
| JP | 61-235424 | A | * | 10/1986 |
| JP | 05297590 | A |   | 11/1993 |
| JP | 06-281801 | A |   | 10/1994 |
| JP | 06-316626 | A |   | 11/1994 |
| JP | 09003405 | A |   | 1/1997 |
| JP | 10219123 | A |   | 8/1998 |
| JP | 2000-159860 | A |   | 6/2000 |
| JP | 2000-196151 | A |   | 7/2000 |
| JP | 2000-292920 |   |   | 10/2000 |
| JP | 2000-344868 |   |   | 12/2000 |
| JP | 2001019721 | A |   | 1/2001 |
| JP | 2001-040022 |   |   | 2/2001 |
| JP | 2001-081416 |   |   | 3/2001 |
| JP | 2001-272775 |   |   | 10/2001 |
| JP | 2001-323135 |   |   | 11/2001 |
| JP | 2003-255120 |   |   | 9/2003 |
| JP | 2006-131867 | A | * | 5/2006 |
| WO | WO 9324569 | A1 |   | 12/1993 |

OTHER PUBLICATIONS

Naugard 445 product data sheet, D-Bond Trading Co., Ltd., 2010, one page.*
Tinuvin 144 product data sheet, Ciba Specialty Chemicals, 2010, three pages.*
Tinuvin 900 product data sheet, Ciba Specialty Chemicals, 2010, three pages.*
CAPLUS accession Nos. 1960:59714 for Netherlands Patent No. 90245, Feb. 1959 and 1957:95365 for equivalent Great Britain Patent No. 781,416, Aug. 1957.
Chemical abstracts registry No. 123-28-4 for dilauryl 3,3'-thiodipropionate, 1997, 2 pages.
Chemical abstracts registry No. 2082-79-3 for ADK Stab AO 50, 1997, 2 pages.

* cited by examiner

*Primary Examiner* — Robert Sellers
(74) *Attorney, Agent, or Firm* — Foley & Lardner LLP

(57) ABSTRACT

A photosemiconductor encapsulating resin composition, excellent in light transmittance, ultraviolet resistance and heat resistance, comprising the following component (A) and component (B):
 (A): a (meth)acrylic polymer containing an epoxy group, and
 (B): at least one hardener selected from the group consisting of the following components ($b_1$) to ($b_4$)
  ($b_1$) a polyvalent carboxylic acid,
  ($b_2$) a polyvalent carboxylic anhydride,
  ($b_3$) a reaction product of a polyvalent carboxylic acid with a compound of the following general formula (B-1), and
  ($b_4$) a reaction product of a polyvalent carboxylic anhydride with a compound of the following general formula (B-2)

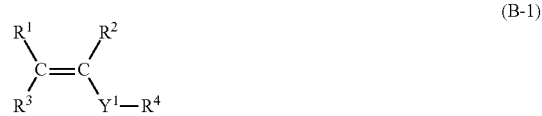

(B-1)

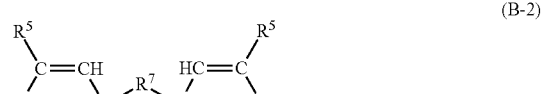

(B-2)

wherein $R^1$ to $R^6$ represent each independently a hydrogen atom or an alkyl group having 1 to 8 carbon atoms, $R^3$ and $R^4$ may be bonded to form an alkylene group having 1 to 8 carbon atoms; $R^7$ represents an alkylene group; a methylene group contained the alkylene group and the alkyl group represented by $R^1$ to $R^7$ may be substituted by an ether group and/or carbonyl group; $Y^1$ and $Y^2$ represent each independently an oxygen atom, or sulfur atom, is provided.

1 Claim, No Drawings

ENCAPSULANT OF EPOXY GROUP-CONTAINING (METH)ACRYLIC POLYMER, ANHYDRIDE AND (METH)ACRYLIC MONOMER

This application is a divisional of U.S. application Ser. No. 10/472,091, filed Sep. 17, 2003, now U.S. Pat. No. 7,423,083, which is a national phase application of PCT/JP2002/009310 filed Sep. 12, 2002.

BACKGROUND OF THE INVENTION

1. Field of the Invention

The present invention relates to a photosemiconductor encapsulating resin composition, a photosemiconductor encapsulating hardened substance obtained by hardening the composition, and a photodiode encapsulated with the hardened substance.

2. Description of Prior Art

Already known as the photosemiconductor encapsulating resin composition used is, for example, a transparent resin composition composed of an alicyclilc type epoxy resin and an acid anhydride hardener (JP-A No. 6-316626), and this publication specifically discloses a photosemiconductor encapsulating resin composition, further containing a methacrylic acid-based phosphate for improving close adherence with a photosemiconductor.

Recently, a light emitting diode emitting light of short wavelength such as blue light, ultraviolet light and the like, and a white color light emitting diode obtained by combining these light emitting diodes with a fluorescent body are practically utilized. To encapsulate these light emitting diodes, encapsulating resin composition are required that transmittance for blue light to ultraviolet light is high and transmittance does not decrease by heat generation in operation (hereinafter, referred to as heat-resistance) or does not decrease by light of short wavelength from a light emitting diode chip, namely, even if irradiated with light of short wavelength having high energy such as blue light, ultraviolet light and the like for a long time, coloration does not occur (hereinafter, referred to as ultraviolet-resistance).

As the resin composition for encapsulating a light emitting diode, a resin composition containing a non-aromatic type epoxy resin as an effective ingredient has been suggested, specifically, a light emitting diode resin composition containing 3,4-epoxycyclohexylmethyl-3,4-epoxycyclohexane carboxylate and methylhexahydrophthalic anhydride as an effective ingredient has been disclosed (JP-A No. 2000-196151).

The present inventors have investigated a transparent resin composition composed of an alicyclic type epoxy resin and an alicyclic carboxylic anhydride, for example, a hardened substance of an epoxy resin composition containing 3,4-epoxycyclohexylmethyl-3,4-epoxycyclohexane carboxylate and methylhexahydrophthalic anhydride as an effective ingredient, used as a resin composition to seal a light emitting diode, and a problem has been made clear that a hardened substance of this composition is, directly after hardening, already colored though transparent, and when stored at high temperature (150° C.), the composition is further colored.

An object of the present invention is to provide a photosemiconductor encapsulating resin composition giving a hardened substance excellent in light transmittance from immediately after hardening, excellent in light transmittance even if irradiated with blue light or ultraviolet light for a long time or used at high temperature for a long time, namely, excellent in any of initial transmittance, ultraviolet-resistance and heat-resistance.

SUMMARY OF THE INVENTION

The present invention provides a photosemiconductor encapsulating resin composition comprising the following component (A) and component (B):

(A): a (meth)acrylic polymer containing an epoxy group, and (B): at least one hardener selected from the group consisting of the following components ($b_1$) to ($b_4$)

($b_1$) a polyvalent carboxylic acid, ($b_2$) a polyvalent carboxylic anhydride, ($b_3$) a reaction product of a polyvalent carboxylic acid with a compound of the following general formula (B-1), and ($b_4$) a reaction product of a polyvalent carboxylic anhydride with a compound of the following general formula (B-2)

(B-1)

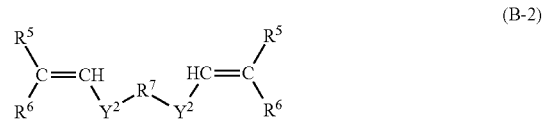

(B-2)

wherein $R^1$ to $R^6$ represent each independently a hydrogen atom or an alkyl group having 1 to 8 carbon atoms, $R^3$ and $R^4$ may be bonded to form an alkylene group having 1 to 8 carbon atoms; $R^7$ represents an alkylene group; a methylene group contained in the alkylene group and the alkyl group represented by $R^1$ to $R^7$ may be substituted by an ether group and/or carbonyl group; $Y^1$ and $Y^2$ represent each independently an oxygen atom, or sulfur atom.

The present invention also provides a hardened substance obtained by hardening the above-mentioned resin composition; and photodiode obtained by encapsulating a photosemiconductor selected from the group consisting of light emitting diode elements and photodiode elements with the above-mentioned hardened substance.

DETAILED DESCRIPTION OF PREFERRED EMBODIMENTS

The component (A) in the present invention is a (meth)acrylic polymer containing an epoxy group, and specifically exemplified are (meth)acrylic polymers containing an epoxy group obtained by polymerizing at least one monomer selected from alkyl acrylates, alkyl methacrylates, acrylonitrile and methacrylonitrile with a monomer of the following general formula (A-1):

R—X—CH$_2$-E        (A-1)

wherein R represents an alkenyl group having 2 to 12 carbon atoms, X represents a carbonyloxy group or methyleneoxy group, and E represents an epoxy group selected from the following moieties:

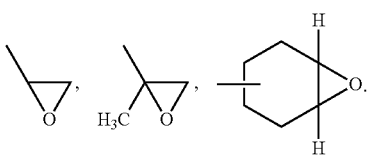

As the monomer of the general formula (A-1), specifically listed are unsaturated glycidyl ethers such as allyl glycidyl ether, 2-methylallyl glycidyl ether and the like; unsaturated glycidyl esters such as glycidyl acrylate, glycidyl methacrylate, glycidyl itaconate and the like; saturated cyclic aliphatic type epoxy (meth)acrylates such as 3,4-epoxycyclohexylmethyl acrylate, 3,4-epoxycyclohexylmethyl methacrylate and the like.

As the monomer of the general formula (A-1), two or more monomers of the general formula (A-1) may be used.

As the monomer of the general formula (A-1), unsaturated glycidyl esters and saturated cyclic aliphatic type epoxy (meth)acrylates are preferable among others, and particularly, 3,4-epoxycyclohexylmethyl acrylate and glycidyl methacrylate are suitable.

As the (meth)acrylic monomer used as the component (A), listed are, for example, alkyl (meth)acrylates having a linear alkyl group having about 1 to 20 carbon atoms such as methyl acrylate, methyl methacrylate, ethyl acrylate, ethyl methacrylate and the like; alkyl (meth)acrylates having a branched alkyl group having about 3 to 20 carbon atoms such as t-butyl acrylate, t-butyl methacrylate and the like; alkyl (meth)acrylates having a saturated cyclic aliphatic alkyl group having about 5 to 20 carbon atoms such as cyclohexyl acrylate, cyclohexyl methacrylate and the like; and (meth)acrylonitriles such as acrylonitrile, methacrylonitrile and the like.

As the (meth)acrylic monomer, two or more (meth)acrylic monomers may be used.

As the (meth)acrylic monomer, alkyl (meth)acrylates are preferable among others, and particularly, alkyl (meth)acrylates having a linear or branched alkyl group having 1 to 4 carbon atoms, or alkyl (meth)acrylates having a saturated cyclic aliphatic alkyl group are preferable.

The content of a structural unit derived from a (meth) acrylic monomer in the component (A) is from about 0 to 95 mol %, preferably from about 10 to 80 mol %.

In production of the component (A), an aliphatic monomer having in the molecule one ethylenical double bond copolymerizable with (meth)acrylic monomers, different from (meth)acrylic monomers, may be polymerized. Specific examples thereof include vinyl alkylates such as vinyl butyrate, vinyl propionate, vinyl pivalate, vinyl laurate, vinyl isononoate, vinyl versatate and the like; vinyl halides such as vinyl chloride, vinyl bromide and the like; vinylidene halides such as vinylidene chloride and the like.

The use amount of the aliphatic monomer in the component (A) is usually 10 parts by weight or less based on 100 parts by weight of the total amount of all monomers constituting a (meth)acrylic polymer, and substantially no use is preferable.

Mentioned as the method of producing the component (A) are, for example,
a method in which monomers used and a radical generator are mixed in an organic solvent such as alcohols such as methanol, isopropanol and the like; ketones such as acetone, methyl ethyl ketone, methyl isobutyl ketone and the like; esters such as ethyl acetate, butyl acetate and the like; aromatic hydrocarbons such as toluene, xylene and the like, further, if necessary, a chain transfer agent is mixed with the mixture, and they are copolymerized at about 60 to 120° C.;
a method in which monomers used are fed to a reactor continuously and the mixture mentioned above is heated at 180-300° C. for 5-60 minutes in the reactor in the absence or presence of polymerization initiator, followed by removing the reaction product from the reactor continuously, as described in JP-A-10-195111;
and other methods.

As the component (A), two or more (meth)acrylic polymers containing an epoxy group may be used.

The epoxy equivalent weight of a (meth)acrylic polymer containing an epoxy group is usually 128 g/equivalent or more, preferably from about 150 to 4500 g/equivalent.

As the (meth)acrylic polymer containing an epoxy group, commercially available products such as, for example, Blemmer CP-50M (glycidyl methacrylate.methyl methacrylate copolymer, manufactured by NOF Corp., and the like may be used.

Providing the hardened substance of the present invention is not colored, an epoxy resin containing substantially no double bond in the molecule, different from a (meth)acrylic polymer containing an epoxy group, may be mixed as the component (A).

Specifically listed as such an epoxy resin containing substantially no double bond in the molecule are hetero-cycle-containing epoxy resins, hydrogenated aromatic type epoxy resins, aliphatic type epoxy resins (glycidyl ethers obtained from aliphatic alcohol and epihalohydrin), glycidyl esters of carboxylic acids (glycidyl esters obtained from aliphatic carboxylic acid and epihalohydrin or glycidyl esters obtained from alicyclic carboxylic acid and epihalohydrin), saturated aliphatic type epoxy resins, spiro-ring-containing epoxy resins and the like.

As the hetero-cycle-containing epoxy resin, for example, hydantoin type epoxy resins, triglycidyl isocyanurate and the like are listed.

As the hydrogenated aromatic type epoxy resin, for example, hydrogenated bisphenol A type epoxy resin, hydrogenated bisphenol F type epoxy resin, hydrogenated phenol novolak type epoxy resin, hydrogenated cresol novolak type epoxy resin, hydrogenated biphenyl type epoxy resin, and the like are listed.

As the aliphatic type epoxy resin, for example, butyl glycidyl ether, 1,6-hexanediol diglycidyl ether, neopentyl glycol diglycidyl ether, cyclohexanedimethanol diglycidyl ether, polypropylene glycol diglycidyl ether, trimethylolpropane triglycidyl ether and the like are listed.

As the glycidyl ester of a carboxylic acid, for example, glycidyl neodecanoate, diglycidyl hexahydrophtalate and the like are listed.

The saturated cyclic aliphatic type epoxy resin is an alicyclic type epoxy resin containing no double bond in the molecule, and listed as examples thereof are 3,4-epoxycyclohexylmethyl-3,4-epoxycyclohexane carboxylate of the following formula (A-2)

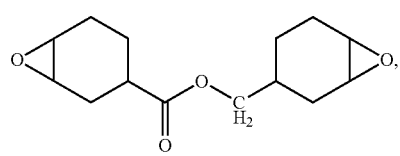

(A-2)

ε-caprolactone-modified 3,4-epoxycyclohexylmethyl-3,4-epoxycyclohexane carboxylate, bis(3,4-epoxycyclohexyl)adipate, 1,2:8,9-diepoxylimonene, and the like.

The content of an epoxy resin containing no carbon-carbon double bond in the molecule in the component (A) is usually not more than the weight of a (meth)acrylic polymer containing an epoxy group.

The component (B) is at least one hardener selected from the group consisting of the following components ($b_1$) to ($b_4$):
- ($b_1$) a polyvalent carboxylic acid,
- ($b_2$) a polyvalent carboxylic anhydride,
- ($b_3$) a reaction product of a polyvalent carboxylic acid with a compound of the following general formula (B-1), and
- ($b_4$) a reaction product of a polyvalent carboxylic anhydride with a compound of the following general formula (B-2)

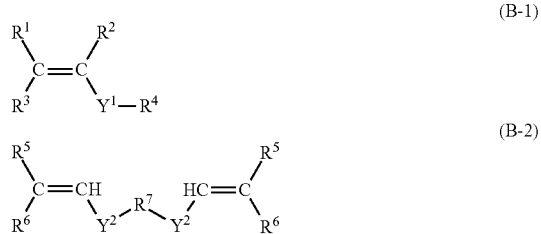

wherein $R^1$ to $R^6$ represent each independently a hydrogen atom or an alkyl group having 1 to 8 carbon atoms, $R^3$ and $R^4$ may be bonded to form an alkylene group having 1 to 8 carbon atoms; $R^7$ represents an alkylene group; a methylene group contained in the alkylene group and the alkyl group represented by $R^1$ to $R^7$ may be substituted by an ether group and/or carbonyl group; $Y^1$ and $Y^2$ represent each independently an oxygen atom, or sulfur atom.

The component ($b_1$) is a compound having about 2 to 22 carbon atoms containing two or more free carboxyl groups in the molecule, and specific examples thereof include aliphatic poly-valent carboxylic acids such as succinic acid, adipic acid, azelaic acid, sebacic acid, decamethylenedicarboxylic acid, dodecenylsuccinic acid, ethyloctadecanedioic acid and the like; aromatic poly-valent carboxylic acids such as phthalic acid, isophthalic acid, terephthalic acid, trimellitic acid, pyromellitic acid, 4,4'-benzophenonetetracarboxylic acid, 3,3',4,4'-oxydiphthalic acid, 3,3',4,4'-biphenyltetracarboxylic acid, phenyloctadecanedioic acid and the like, alicyclic poly-valent carboxylic acids such as hexahydrophthalic acid, methyltetrahydrophthalic acid, methylhexahydrophthalic acid, 5-norbornane-2,3-dicarboxylic acid, 5-norbornene-2,3-dicarboxylic acid, methylnorbornane-2,3-dicarboxylic acid, methylnorbornene-2,3-dicarboxylic acid, 1,4,5,6,7,7-hexachloro-5-norbornene-2,3-dicarboxylic acid, 5-(2,5-dioxotetrahydro-3-furanyl)-3-methyl-3-cyclo-hexene-1,2-dicarboxylic acid, 5-(2,5-dioxotetrahydro-3-furanyl)norbornane-2,3-di-carboxylic acid, and the like; acrylic resins obtained by polymerizing (meth)acrylic acid; maleated polybutadiene resin and the like.

The component ($b_2$) is an intra-molecular acid anhydride and/or inter-molecular acid anhydride of the component ($b_1$), and specific examples thereof include aromatic poly-valent carboxylic anhydrides such as phthalic anhydride, tetrabromophthalic anhydride, tetrahydrophthalic anhydride, pyromellitic anhydride, 4,4'-benzophenonetetracarboxylic dianhydride, 3,3',4,4'-oxydiphthalic dianhydride, 3,3',4,4'-biphenyltetracarboxylic dianhydride, ethylene glycol bistrimellitate (manufactured by New Japan Chemical Co., Ltd., trade name: TMEG), glycerol tristrimellitate (manufactured by New Japan Chemical Co., Ltd., trade name: TMTA) and the like; alicyclic poly-valent carboxylic anhydrides such as hexahydrophthalic anhydride, methyltetrahydrophthalic anhydride, methylhexahydrophthalic anhydride, 5-norbornane-2,3-dicarboxylic anhydride, 5-norbornene-2,3-dicarboxylic anhydride, methylnorbornane-2,3-dicarboxylic anhydride, methylnorbornene-2,3-dicarboxylic anhydride, Diels-Alder reaction products of maleic anhydride with a $C_{10}$ diene (manufactured by Japan Epoxy Resin, YH-306 and the like), 1,4,5,6,7,7-hexachloro-5-norbornene-2,3-dicarboxylic anhydride, 5-(2,5-dioxotetrahydro-3-furanyl)-3-methyl-3-cyclo-hexene-1,2-dicarboxylic anhydride, 5-(2,5-dioxotetrahydro-3-furanyl)norbornane-2,3-dicarboxylic anhydride, and the like; aliphatic poly-valent carboxylic anhydrides such as dodecenylsuccinic anhydride, polyadipic anhydride, polyazelaic anhydride, polysebacic anhydride, poly(ethyloctadecanedioic) anhydride, poly (phenyloctadecanedioic) anhydride and the like; etc.

As the component ($b_2$), intra-molecular acid anhydrides are preferable among others, and particularly, intra-molecular acid anhydrides of alicyclic poly-valent carboxylic acids are preferable, and of them, alicyclic carboxylic anhydrides containing substantially no double bond in the molecule such as hexahydrophthalic anhydride, methylhexahydrophthalic anhydride, norbornane-2,3-dicarboxylic anhydride, methylnorbornane-2,3-dicarboxylic anhydride, 5-(2,4-dioxotetrahydro-3-furanylmethyl)norbornane-2,3-dicarboxylic anhydride and the like are preferable.

The component ($b_3$) is a reaction product of the above-mentioned poly-valent carboxylic acid ($b_1$) and a compound of the general formula (B-1), in which a free carboxylic group in ($b_1$) is protected by the general formula (B-1). Here, listed as examples of the compound of the general formula (B-1) are aliphatic vinyl ether compounds such as methyl vinyl ether, ethyl vinyl ether, isopropyl vinyl ether, n-propyl vinyl ether, n-butyl vinyl ether, isobutyl vinyl ether, 2-ethylhexyl vinyl ether, cyclohexyl vinyl ether and the like and aliphatic vinyl thioether compounds obtained by substituting an ether group in the above-mentioned compounds by a thio ether group, further, cyclic vinyl ether compounds such as 2,3-dihydrofuran, 2,5-dihydrofuran, 3,4-dihydro-2H-pyran, 3,4-dihydro-2-methoxy-2H-pyran, 3,4-dihydro-6-methyl-2H-pyran-2-one, 5,6-dihydro-4-methoxy-2H-pyran, 3,4-dihydro-2-ethoxy-2H-pyran and the like and cyclic vinyl thioether compounds obtained by substituting an ether group in the above-mentioned compounds by a thio ether group, and the like.

The component ($b_4$) is a reaction product of the above-mentioned poly-valent carboxylic anhydride ($b_2$) and a compound of the general formula (B-2), in which an acid anhydride group in ($b_2$) is ring-opened and protected by the general formula (B-2). Here, listed as examples of the compound of the general formula (B-2) are trimethylene glycol divinyl ether, ethylene glycol divinyl ether, polyethylene glycol divinyl ether, butanediol divinyl ether, pantanediol divinyl ether, hexanediol divinyl ether, 1,4-cyclohexanedimethanol vinyl ether, vinyl etherified compound of hydroquinone, vinyl etherified compound of bisphenol A, vinyl etherified compound of bisphenol F, divinyl thioethers obtained by substituting an ether group in these compounds with a thio ether group.

As the component (B) used in the photosemiconductor encapsulating resin composition of the present invention, the component ($b_2$) is preferable among others.

The content of the component (B) in the resin composition differs depending on the kinds of ($b_1$) to ($b_4$) and in the case of ($b_1$), the content of a free carboxyl group in ($b_1$) is preferably from about 1.0 to 3.0 mol, more preferably from about 1.6 to 2.4 mol based on 1 mol of the total amount of epoxy groups contained in the component (A), and in the case of ($b_2$), the content of an acid anhydride group (—CO—O—CO—) in ($b_2$) is preferably from about 0.5 to 1.5 mol, more preferably from about 0.8 to 1.2 mol based on 1 mol of the total amount of epoxy groups contained in the component (A). In the case of ($b_3$), the content of an ester group obtained by reaction with (B-1) is preferably from about 1.0 to 3.0 mol, more preferably from about 1.6 to 2.4 mol based on 1 mol of the total amount of epoxy groups contained in the component (A), and in the case of ($b_4$), the content of an ester group obtained by reaction with (B-2) is preferably from about 1.0 to 3.0 mol, more preferably from about 1.6 to 2.4 mol based on 1 mol of the total amount of epoxy groups contained in the component (A).

The component (B) may contain a hardening accelerator, if necessary. As the hardening accelerator, for example, tertiary amines, tertiary amine salts, quaternary ammonium salts, imidazole compounds, diazabicycloalkene compounds and salts thereof, phosphine compounds, quaternary phosphonium salts, boron compounds, alcohols, metal salts, organic metal complex salts and the like are listed.

Here, as the tertiary amine, for example, triethanolamine, tetramethylhexanediamine, triethylenediamine, dimethylaniline, dimethylaminoethanol, diethylaminoethanol, 2,4,6-tris(dimethylaminomethyl)phenol, N,N'-dimethylpiperazine, pyridine, picoline, benzyldimethylamine and 2-(dimethylamino)methylphenol and the like are listed, and as the tertiary amine salt, 2-ethylhexanoate salt, octylate salt of tertiary amine, and the like are listed.

As the quaternary ammonium salts, for example, dodecyltrimethylammonium chloride, cetyltrimethylammonium chloride, benzyldimethyltetradecylammonium chloride and stearyltrimethylammonium chloride, and those obtained by substituting the above-mentioned chloride by a bromide or iodide, and the like are listed.

As the imidazole compound, for example, 1-benzyl-2-phenylimidazole, 2-methylimidazole, 2-undecylimidazole, 2-ethylimidazole, 1-benzyl-2-methylimidazole, 1-cyanoethyl-2-undecylimidazole and the like are listed.

As the diazabicycloalkene compound and salt thereof, for example, 1,8-diaza-bicyclo(5,4,0)undec-7-ene, 1,5-diazabicyclo(4,3,0)non-5-ene, and phenol salts, octylate salts, p-toluenesulfonate salts, formate salts, orthophthalate salts and tetraphenylborate salts thereof, and 8-benzyl-1-aza-8-azoniadiazabicyclo(5.4.0)undec-7-ene tetraphenylborate and the like are listed.

As the phosphine compound, for example, triphenylphosphine, tri-n-butylphosphine, tri-n-octylphosphine, tritolylphosphine, tricyclohexylphosphine, tri-p-methoxyphenylphosphine, tris-(2,6-dimethoxyphenyl)phosphine and the like are listed.

As the quaternary phosphonium salt, for example, tetra-n-butylphosphonium bromide, tetra-n-butylphosphonium benzotriazolate, tetra-n-butylphosphonium tetrafluoroborate, tetra-n-butylphosphonium tetraphenylborate, tetraphenylphosphonium bromide, methyltriphenylphosphonium bromide, ethyltriphenylphosphonium bromide, ethyltriphenylphosphonium iodide, ethyltriphenylphosphonium acetate, n-butyltriphenylphosphonium bromide, benzyltriphenylphosphonium chloride, tetraphenylphosphonium tetraphenylborate and the like are listed.

As the boron compound, for example, tetraphenylboron salts such as triethyleneamine tetraphenylborate, N-methylmorpholine tetraphenylborate and the like are listed.

As the alcohols, for example, ethylene glycol, glycerins and the like are listed.

As the hardening accelerator, two or more hardening accelerators may be used.

As the hardening accelerator, quaternary phosphonium salts, imidazole compounds, diazabicycloalkene compounds and salts thereof are preferable, among others.

For further improving the heat-resistance of a hardened substance obtained from the photosemiconductor encapsulating resin composition of the present invention, it is recommendable to allow the composition to contain antioxidant as an additive.

As the antioxidant, for example, (C) phenol-based antioxidants, (D) sulfur-based antioxidants, phosphorus-based antioxidants and the like are listed.

As the phenol-based antioxidant (C) used in the present invention, for example, phenol-based antioxidants of the following general formula (C-1):

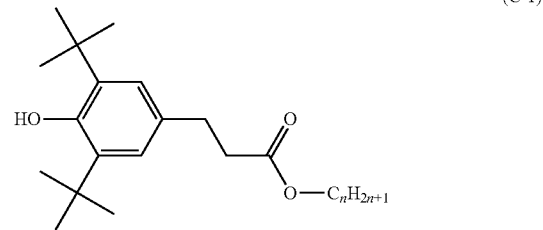

(C-1)

wherein n represents an integer of 1 to 22, are listed, and particularly, phenol-based antioxidants having a carbon number n of from about 8 to 18 are suitable.

The content of the component (C) in the resin composition of the present invention is preferably from about 0.03 to 3 parts by weight, more preferably from about 0.1 to 1 part by weight based on 100 parts by weight of the total amount of the component (A) and the component (B).

As the sulfur-based antioxidant (D) used in the present invention, for example, compounds of the following general formula (D-1):

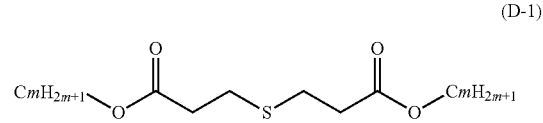

(D-1)

wherein m represents an integer of 10 to 22, are listed, and particularly, sulfur-based antioxidants in which m represents an integer of 12 to 19 are suitable.

The content of the component (D) in the resin composition of the present invention is preferably from about 0.03 to 3 parts by weight, more preferably from about 0.1 to 1 part by weight based on 100 parts by weight of the total amount of the component (A) and the component (B).

As the antioxidant, (C) phenol-based antioxidants, and (D) sulfur-based antioxidants are preferable, and particularly, it is preferable to used (C) and (D) together.

The photosemiconductor encapsulating resin composition of the present invention may contain additives such as a mold releasing agent, silane coupling agent, stress-releasing agent, filler, plasticizer, de-foaming agent, thixotrope agent, dye, light scattering agent, ultraviolet absorber and the like, in an amount not deteriorating light transmittance, heat-resistance and ultraviolet-resistance of the resulting hardened substance.

As the method of producing a photosemiconductor encapsulating resin composition, for example, when the component (A), component (B) and additives and the like are mainly in the form of solid, listed are a method in which the component (A), component (B) and additives and the like are finely ground, then, mixed; a method in which the component (A), component (B) and additives and the like are melt kneaded in a kneader; a method in which the component (A), component (B) and additives and the like are dissolved in a solvent and uniformly stirred and mixed, then, the solvent is removed, and when the component (A) component (B) and additives and the like are mainly in the form of liquid, listed are a method in which these are stirred and mixed; a method in which the component (A), component (B) and additives and the like are dissolved in a solvent and uniformly stirred and mixed, then, the solvent is removed, and other methods.

When the resulted resin composition is solid at normal temperature, it may be further crushed and tabletted.

The resin composition of the present invention is usually cured by heating at the temperature from 80 to 200° C., preferably from 100 to 180° C., more preferably from 120 to 200° C. for from about 0.2 to 24 hours. In the case of hardening, the step cure that combined two or more steps of different conditions is also possible.

The hardened substance of the present invention is a thus obtained hardened substance of a resin composition. The initial transmittance of the hardened substance is usually about 70% or more. A more preferred hardened substance having the initial transmittance of about 75% or more can be obtained by using an alicyclic carboxylic anhydride containing substantially no double bond in the molecule as the component (B).

Here, for obtaining the initial transmittance, a resin composition is hardened and cooled to room temperature, and the resulted hardened substance is controlled to have a thickness of 2 mm, and within two days after cooling, the transmittance along the thickness direction at a wavelength of 370 nm is measured.

The hardened substance of the present invention is excellent in ultraviolet-resistance and heat-resistance.

The hardened substance of the present invention usually has a transmittance in an ultraviolet resistance test of about 40% or more. Here, the ultraviolet-resistance test indicates a test in which a hardened substance having a thickness controlled at 2 mm is irradiated with light having a light quantity of 0.55 W/m$^2$ at 340 nm, under conditions of 40° C. and 50% RH, for 300 hours, then, the transmittance along the thickness direction at a wavelength of 370 nm is measured.

The hardened substance of the present invention usually has a transmittance in a heat resistance test of about 40% or more. The heat-resistance test indicates a test in which a hardened substance having a thickness controlled at 2 mm is stored for 72 hours under a condition of 150° C., then, the transmittance along the thickness direction at a wavelength of 370 nm is measured.

When the transmittance after the ultraviolet resistance test and the heat resistance test is about 40% or more, it means that coloration by ultraviolet and heat is prevented. A hardened substance having this transmittance of 50% or more is particularly preferable. Such a hardened substance having the transmittance of 50% or more can be obtained by using an alicyclic carboxylic anhydride containing substantially no double bond in the molecule as the component (B), using together quaternary phosphonium salts, imidazole compounds, diazabicycloalkene compounds and salts thereof as the hardening accelerator, and adding a phenol-based antioxidant (C) and/or sulfur-based antioxidant (D) as the antioxidant.

The glass transition temperature of the hardened substance of the present invention is usually about 130° C. or more. When the glass transition temperature is 130° C. or more, a tendency of more excellent heat-resistance is preferably observed.

The photodiode of the present invention is the one obtained by, for example, encapsulating a photosemiconductor such as a light emitting diode element, photodiode element and the like with the hardened substance of the present invention.

As the method of producing a photodiode, listed are, for example, a method in which a photosemiconductor is equipped with an electrode such as a lead line and the like if necessary, subsequently, the photosemiconductor is encapsulated with the resin composition of the present invention and hardened according to a mold method such as transfer molding, casting and the like; a method in which a photosemiconductor is mounted on a substrate, and this is encapsulated with the resin composition of the present invention and hardened, and other methods.

On the photodiode of the present invention, a light emitting body differing from a photosemiconductor, such as a fluorescent bodies and the like may be mounted.

The hardened substance obtained by hardening the photosemiconductor encapsulating resin composition of the present invention is excellent in light transmittance for visible light, ultraviolet light and the like, and even if irradiated with light of short wavelength having high energy such as blue light, ultraviolet light and the like, for a long time, coloration is little, and light transmittance is excellent. Further, even if used at high temperature for a long time, the photosemiconductor encapsulating resin composition of the present invention is excellent in light transmittance.

Since the resin composition of the present invention give a hardened substance having such excellent properties, the resin composition can be used in transparent electric and electronic part encapsulating materials such as a light emitting diode and the like, and in transparent paints, transparent adhesives, materials substituted for glass, and the like.

The following examples will illustrate the present invention further in detail, but do not limit the scope of the invention. Parts and % in examples are by weight unless otherwise stated.

<Method of Measurement of Physical Properties of Hardened Substance>

(1) Initial Transmittance

A resin composition was hardened, and when cooled to room temperature, or within two days from cooling, the transmission spectrum of a hardened substance having a thickness of 2 mm was measured by a spectrophotometer V-560 manufactured by Nippon Bunko K.K., and the transmittance at a wavelength of 370 nm was calculated.

(2) Transmittance After Stored at High Temperature

A hardened substance was stored for 72 hours in an convection oven, then, the transmittance at a wavelength of 370 nm was measured according to the same manner as in (1).

(3) Transmittance After Irradiation with Ultraviolet Light

A hardened substance was irradiated with light having a light quantity of 0.55 W/m$^2$ at 340 nm, under conditions of 40° C. and 50% RH, for 300 hours, using ATLAS Ci4000 Xenon Weather-Ometer, then, the transmittance at a wavelength of 370 nm was measured according to the same manner as in (1).

(4) Glass Transition Temperature (Tg)

Measurement was conducted under conditions of a temperature raising rate of 10° C./min. and a load of 10 g using TMA-100 Thermomechanical Analyzer manufactured by Seiko Instruments Inc., and the inflection point of a TMA curve was read and used as the glass transition temperature (Tg).

Example 1

A hardener was produced by adding 1 part of U-CAT 5003 (quaternary phosphonium bromide, manufactured by SAN-APRO Ltd.) as a hardening accelerator to 100 parts of HN-5500 (methylhexahydrophthalic anhydride, manufactured by Hitachi Chemical Co., Ltd.) as a component (B).

55 parts of the above-mentioned hardener component and 100 parts of Blemmer CP-50M (glycidyl methacrylate-methyl methacrylate copolymer, Mw=10000, epoxy equivalent weight=310 g/equivalent, Tg=70° C., manufactured by NOF Corp.) as a component (A) were dissolved in 100 parts of acetone, and uniformly mixed, then, acetone was distilled off by a vacuum drier, to obtain a photosemiconductor encapsulating resin composition which was solid at room temperature. In the procedure, the molar ratio of epoxy groups to acid anhydrides was 1/1.

This resin composition was placed on a glass plate heated previously at 100° C., and sandwiched with a separate glass plate heated previously at 100° C., via a 2 mm spacer, and fixed by a clip, consequently, the resin composition was melted and molded into a plate having a thickness of 2 mm. While being fixed by a clip, the resin composition was hardened at 100° C. for 2 hours, subsequently, at 120° C. for 2 hours, to give a hardened substance having a thickness of 2 mm.

The results of measurement of physical properties of the hardened substance are shown in Table 1.

Example 2

A resin composition was obtained in the same manner as in Example 1 except that the hardening accelerator was changed to tetra-n-butylphosphonium bromide (manufactured by HOKKO CHEMICAL INDUSTRY CO., LTD., TBP-BB).

This resin composition was hardened under press with a heat press at 100° C. for 2 hours, then, hardened for 2 hours in a convection oven of 120° C., to obtain a hardened substance having a thickness of 2 mm. The results of measurement of physical properties of the hardened substance are shown in Table 1.

Example 3

A resin composition and hardened substance were obtained in the same manner as in Example 2 except that 0.5 parts of a phenol-based antioxidant of the following formula (C-2) was added based on 100 parts of the resin composition in Example 2. The results of measurement of physical properties of the hardened substance are shown in Table 1.

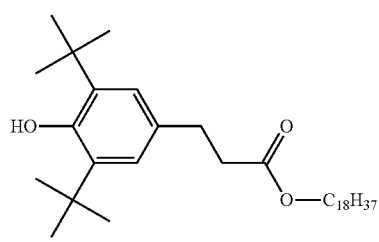

(C-2)

Example 4

A resin composition and hardened substance were obtained in the same manner as in Example 2 except that 0.25 parts of a phenol-based antioxidant of the formula (C-2) and 0.25 parts of a sulfur-based antioxidant of the following formula (D-2) were added based on 100 parts of the resin composition in Example 2. The results of measurement of physical properties of the hardened substance are shown in Table 1.

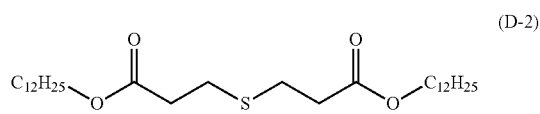

(D-2)

Comparative Example 1

92 parts of the hardener component obtained in Example 1 was added to 100 parts of Epothoto YD-128M (bisphenol A diglycidyl ether, epoxy equivalent weight=185, manufactured by Tohto Kasei Co., Ltd.) as a component (A), and they were stirred and mixed, to obtain a resin composition which is in the form of solution at room temperature. In this operation, the molar ratio of epoxy groups to acid anhydrides was 1/1. Two glass plates were fixed via a 2 mm spacer to give a mold which was pre-heated at 100° C. A resin composition was injected into the mold, then, hardened at 100° C. for 2 hours, subsequently, at 120° C. for 2 hours, to give a hardened substance having a thickness of 2 mm.

The results of measurement of physical properties of the hardened substance are shown in Table 1.

Comparative Example 2

75 parts of Epothoto YD-128M and 25 parts of Celloxide 2021 P (3,4-epoxycyclohexylmethyl 3,4-epoxycyclohexane carboxylate, epoxy equivalent weight=134, manufactured by Daicel Chemical Industries, Ltd.) were mixed and used as a component (A). This mixture (component (A)) had an epoxy equivalent weight of 169.

100 parts of this component (A) and 100 parts of the hardener component obtained in Example 1 were stirred and mixed, to obtain a resin composition which is in the form of solution at room temperature. In this operation, the substance ratio (equivalent) of epoxy groups to acid anhydrides was 1/1. Subsequently, the resin composition was molded and hardened in the same manner as in Comparative Example 1, to give a hardened substance having a thickness of 2 mm.

The results of measurement of physical properties of the hardened substance are shown in Table 1.

Comparative Example 3

127 parts of the hardener component obtained in Example 1 was added to 100 parts of Celloxide 2021 P as a component (A), and they were stirred and mixed, to obtain a resin composition which is in the form of solution at room temperature. In this operation, the molar ratio of epoxy groups to acid anhydrides was 1/1. Subsequently, the resin composition was molded and hardened in the same manner as in Comparative Example 1, to give a hardened substance having a thickness of 2 mm.

The results of measurement of physical properties of the hardened substance are shown in Table 1.

Comparative Example 4

81 parts of the hardener component obtained in Example 1 was added to 100 parts of HBPADGE (hydrogenated bisphenol A diglycidyl ether, epoxy equivalent weight=210, manufactured by Maruzen Petrochemical Co., Ltd.) as a component (A), and they were stirred and mixed, to obtain a resin composition which is in the form of solution at room temperature. In this operation, the molar ratio of epoxy groups to acid anhydrides was 1/1. Subsequently, the resin composition was molded and hardened in the same manner as in Comparative Example 1, to give a hardened substance having a thickness of 2 mm.

The results of measurement of physical properties of the hardened substance are shown in Table 1.

TABLE 1

|  |  | Example | | | | Comparative example | | | |
|---|---|---|---|---|---|---|---|---|---|
|  |  | 1 | 2 | 3 | 4 | 1 | 2 | 3 | 4 |
| Transmittance (%) | (1) | 76 | 78 | 80 | 79 | 71 | 67 | 67 | 73 |
|  |  | o | o | o | o | o | x | x | o |
|  | (2) | 51 | 50 | 62 | 69 | 50 | 41 | 39 | 39 |
|  |  | o | o | o | o | o | o | x | x |
|  | (3) | 52 | 46 | 50 | 51 | 27 | 37 | 60 | 60 |
|  |  | o | o | o | o | x | x | o | o |
| Tg (°C) | (4) | 145 | 138 | 138 | 138 | 131 | 133 | 159 | 114 |

(1) Initial transmittance o: when 70% or more, x: when less than 70%
(2) Transmittance after storage at high temperature (150° C. × 72 hours) o: when 40% or more, x: when less than 40%
(3) Transmittance after irradiation wit ultraviolet light (irradiation wit light having a light quantity of 0.55 W/m² at 340 nm, for 300 hours) o: when 40% or more, x: when less than 40%

What is claimed is:

1. A photosemiconductor encapsulating resin composition having a glass transition temperature of 130° C. or more upon hardening and consisting of the following components (A), (B), (C), and (D):

(A): a (meth)acrylic polymer containing an epoxy group having an epoxy equivalent weight of 150 to 4500 g/equivalent polymerized from an epoxy group-containing monomer and from about 10 to 80 mol % of at least one (meth)acrylic monomer other than the epoxy group-containing monomer, the (meth)acrylic monomer selected from the group consisting of alkyl(meth)acrylate having a linear alkyl group having about 1 to 20 carbon atoms; alkyl(meth)acrylate having a branched alkyl group having about 3 to 20 carbon atoms; alkyl(meth)acrylate having a saturated cyclic aliphatic alkyl group having about 5 to 20 carbon atoms; and (meth)acrylonitrile (B): an alicyclic carboxylic anhydride, (C): a hardening accelerator, and (D): an antioxidant, selected from the group consisting of (i) a phenol-based antioxidant and (ii) a phenol-based antioxidant and a sulfur-based antioxidant;

wherein the content of a constituent unit derived from the (meth)acrylic monomer of (A) is about 10 to 80 mol %.

* * * * *